Aug. 7, 1956 S. P. JACKSON 2,758,161

HIGH GAIN SELF-SATURATING MAGNETIC AMPLIFIER

Filed Dec. 5, 1952

Inventor:
Stuart P. Jackson,
by Claude A. Mott
His Attorney.

United States Patent Office 2,758,161

Patented Aug. 7, 1956

2,758,161

HIGH GAIN SELF-SATURATING MAGNETIC AMPLIFIER

Stuart P. Jackson, Lynn, Mass., assignor to General Electric Company, a corporation of New York Application December 5, 1952, Serial No. 324,332

11 Claims. (Cl. 179—171)

Figure 1:
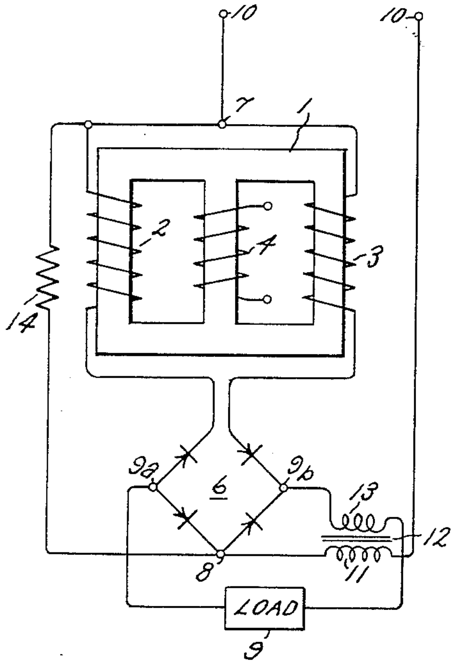

My invention relates to self-saturating magnetic amplifiers, and is particularly applicable to self-saturating magnetic amplifiers of the single-ended type.

These magnetic amplifiers are constituted of saturable core reactor devices provided with means for rectifying the current flowing in the reactor windings, thereby to render the amplifier operable by self-saturation. The output circuit of such an amplifier may be arranged to carry either alternating current or direct current, and the direct current output circuit type may have their reactor windings connected to the alternating current supply line either by a center tap connection or a bridge type connection. Such amplifiers may be used either single-ended or connected in push-pull relation.

It is well recognized that in both single-ended and push-pull magnetic amplifiers the response characteristic, i. e., output as a function of input, is appreciably affected by variation of applied alternating voltage. Efforts have been made to minimize this effect by providing negative feedback windings on the amplifier core itself. To increase gain, however, positive feedback is required. Such feedback also has been provided in windings on the amplifier core. Positive feedback windings on the core, however, tend to produce instability of the amplifier. I have discovered that the input voltage variation effect of both single-ended and push-pull amplifiers may be utilized to provide a positive feedback effect which has the advantage of increasing gain and linearity without causing instability. In single-ended units, my invention also has the further effect of reducing the minimum output current.

Accordingly, therefore, it is a general object of my invention to improve the linearity and the gain of self-saturating magnetic amplifiers.

It is a more particular object of my invention to improve the linearity and the gain of single-ended, self-saturating magnetic amplifiers.

Another object is to decrease the minimum output current in single-ended, self-saturating magnetic amplifiers.

It is a still further object of my invention to increase the range of self-saturating magnetic amplifiers, and more particularly to do this in conjunction with means for improving the gain and linearity of such amplifiers.

In carrying out my invention in one form, I provide in series circuit relation between a pair of constant voltage alternating supply terminals and reactor windings of a self-saturating magnetic amplifier, a voltage varying means or controlling device, such as a saturable core reactor, in combination with means for controlling the reactor device in accordance with the output current of the amplifier. Specifically, the saturating winding of the saturable reactor may be connected in series circuit relation, in the output circuit of a direct current output amplifier, or may be energized through a rectifier connected in series either directly or through a current transformer, in the output circuit of an amplifier having an alternating current output circuit. To render such a device significantly effective in operation, I provide also an electric impedance, such as a resistance element, connected as a bleeder across the alternating current supply line in parallel circuit relation with the amplifier, i. e., in series circuit relation with the voltage controlling saturable reactor. To further increase the gain of either single-ended or push-pull amplifiers, and to increase the range of operation of a single-ended, self saturating magnetic amplifier embodying my invention, I utilize the bleeder resistor to provide a variable bias voltage supplied to a biasing winding on the amplifier core in differential relation with the direction of net signal excitation.

Figure 3:
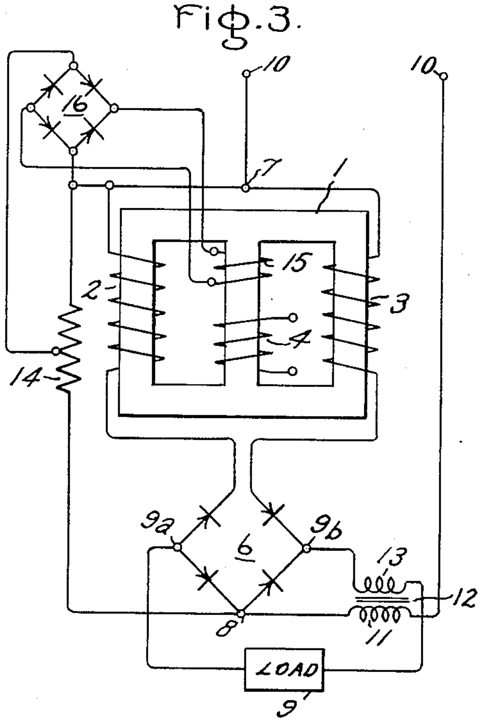
Figure 2:
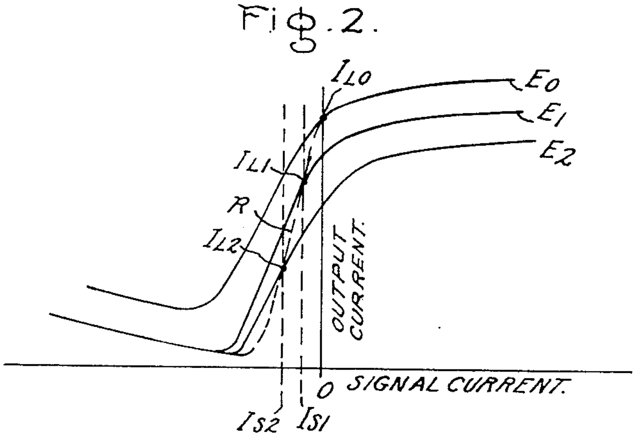
Figure 4:
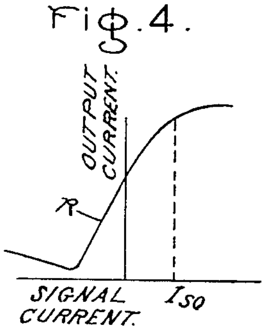

My invention itself will be more fully understood and its various objects and advantages further appreciated by referring now to the following detailed specification taken in conjunction with the accompanying drawing, in which Fig. 1 is a schematic circuit diagram of a self-saturating magnetic amplifier embodying my invention; Fig. 2 is a graphical representation of the operating characteristics of the amplifier shown at Fig. 1; Fig. 3 is a schematic circuit diagram of a self-saturating magnetic amplifier embodying my invention in another form; and Fig. 4 is a graphical representation of the operating characteristic of the amplifier shown at Fig. 3.

Referring now to the drawing, and particularly to Fig. 1, I have there shown a single-ended, bridge-connected, self-saturating magnetic amplifier comprising a three-legged core 1 having wound on the outside legs thereof a pair of reactor windings 2 and 3, and on the center leg a direct current signal winding 4. The reactor windings 2 and 3 are connected in adjacent arms of a rectifier bridge 6 between a pair of amplifier alternating current input terminals 7 and 8, the terminal 7 being common to the reactor windings. The amplifier input terminals 7 and 8 are connected to a pair of constant voltage alternating current supply terminals 10 in series circuit relation with the alternating current winding 11 of a saturable core reactor 12 having a direct current saturating winding 13. The direct current saturating winding 13 of the saturable reactor 12 is connected in series circuit relation with a load device 9 between the bridge output terminals 9*a* and 9*b* in a direct current output circuit for the amplifier. It will, of course, be understood by those skilled in the art that in a magnetic amplifier of the type having an alternating current output circuit, the saturating winding 13 would be coupled to the amplifier load or output circuit through a rectifier, and, if desired, a current transformer could be interposed between the rectifier and the output circuit, all without impairing the series circuit relation of the saturating winding 13.

It will be evident that with the circuit thus far described, any reduction in amplifier output current increases the impedance of the saturable reactor 12, but that the accompanying decrease in line current (which is a function of load current) counteracts this effect by tending to maintain the voltage drop in the reactor unchanged. For the purpose, therefore, of rendering the series reactor effective to significantly change the voltage applied to the amplifier terminals, I connect across the input terminals 7 and 8 (i. e., across the supply terminals 10 in series circuit relation with the reactor winding 11) a bleeder resistor 14. With such a resistor inserted, an alternating current not a function of load current is always maintained through the saturable reactor winding 11 so that changes in reactor saturation are not fully counteracted by line current change and the reactive voltage drop in the reactor is significantly responsive to load current magnitude.

The operation of the amplifier circuit shown at Fig. 1 will now be evident from an examination of Fig. 2. At Fig. 2 I have shown a family of amplifier characteristic curves $E_0$, $E_1$ and $E_2$ showing amplifier output circuit current as ordinates plotted against amplifier signal input current (winding 4) as abscissa. As is well known, the amplifier characteristic varies appreciably in response to applied voltage, and the family of curves $E_0$, $E_1$ and $E_2$ represent the various amplifier characteristics for different voltages applied at the amplifier alternating current input terminals 7 and 8. With zero signal current applied to the winding 4, the amplifier output current is near its maximum, so that the impedance of the saturable reactor 12 is a minimum. The alternating voltage applied to the amplifier input terminals 7 and 8 is then a maximum and may be assumed to be $E_0$. The amplifier output current is then represented by a point $I_{L0}$ on the curve $E_0$. If now the signal current is increased in a negative sense to a value $I_{S1}$, the amplifier output current would ordinarily diminish along the curve $E_0$. With the saturable reactor 12 in the circuit, however, the decrease in amplifier output current increases the impedance of the reactor 12, thereby to decrease to the value $E_1$ the voltage applied to the amplifier input terminals 7 and 8, so that the output current is now represented by the point $I_{L1}$ on the curve $E_1$. Similarly, if the signal current is further increased in a negative direction to a value $I_{S2}$, the alternating current of voltage applied to the terminals 7 and 8 decreases to a value $E_2$ and the amplifier output current is represented by a value $I_{L2}$ on the curve $E_2$. It will now be evident that the resultant amplifier characteristic is represented by a curve drawn through the points $I_{L0}$, $I_{L1}$ and $I_{L2}$, this being the curve R of Fig. 2. It will be noted that the curve R is of steeper slope than the curves $E_0$, $E_1$ or $E_2$, thereby indicating an increase in amplifier gain. It has been found also that the curve R is substantially linear over a wider range and provides a smaller minimum amplifier output current.

For a single-ended, self-saturating magnetic amplifier, the output current characteristic is usually similar to those shown in the curves $E_0$, $E_1$ and $E_2$ of Fig. 2, so that the high output current end of the substantially linear amplifier range occurs at zero signal current, and the applied signal current is normally negative. The amplifier is thus normally usable in a range between zero signal current and that negative signal current which provides minimum output current. This is not affected by the fact that in some cases a fixed unidirectional bias on the amplifier, as by a fixed bias winding, may be necessary to locate the zero signal current axis as desired.

I have discovered that magnetic amplifiers embodying my invention, as described in connection with Figs. 1 and 2, may be further improved in their gain characteristics and single-ended units may be provided with a wider range of operation by utilizing the voltage across the bleeder resistor 14 to provide a variable bias for the amplifier in differential relation to the direction of signal winding excitation. I have illustrated such a variably biased amplifier at Fig. 3. At Fig. 3 the magnetic amplifier is connected across the supply terminals 10 in series circuit relation with the saturable reactor 12, and provided with a bleeder resistor 14 in the same manner as described in connection with Fig. 1, and all other corresponding parts at Fig. 3 have been assigned the same reference numerals as at Fig. 1. In addition, however, the amplifier shown at Fig. 3 is provided on its center core leg with a direct current biasing winding 15, which is connected through a rectifier bridge 16 across a portion of the bleeder resistor 14. The winding 15 is so disposed upon the core 1 that the variable magnetic biasing flux established by this winding is differentially related to the control flux established by normal energization of the signal winding 4 in the negative sense. If a fixed bias winding is provided, the variable bias from winding 15 is still in opposition to the normal direction of signal winding excitation.

It will now be evident that, in operation, the amplifier shown at Fig. 3 varies its own input voltage in response to output current as described, and thus operates over a resultant characteristic such as that of the curve R, Fig. 2. Such a characteristic is redrawn as the curve R of Fig. 4. In addition, however, the bias winding 15 variably controls the effective signal energization of the core in accordance with the voltage applied to the amplifier input terminals 7 and 8. Thus, when the signal current in the winding 4 is zero, so that the output current is high and the input voltage at the terminals 7 and 8 correspondingly high, a relatively large biasing potential is supplied to the winding 15 in such a direction that the effective signal energization of the core is represented by a positive signal current $I_{S0}$. As the signal current in the winding 4 is increased in the negative direction, the voltage appearing across the amplifier input terminals 7 and 8 is decreased by the action of the saturable reactor 12, so that the differential bias energization supplied by the winding 15 is decreased, until at the point of minimum output current the impedance of the reactor 12 is very high and the input voltage applied to the terminals 7 and 8 very low, so that only a very small amount of bias energization is provided by the winding 15. It will thus be evident to those skilled in the art that for single-ended amplifiers in which signal current is not reversible the usable range of amplification is appreciably increased by utilizing the variable bias winding 15. Similarly, the effective output current is increased for any predetermined signal current, so that amplifier gain is further improved by the variable bias winding.

It may now be noted that while I have illustrated my invention applied to a single-ended, self-saturating magnetic amplifier of the bridge connected type, it is equally applicable to other types of single-ended, self-saturating magnetic amplifiers and to push-pull connected amplifiers.

Accordingly, therefore, while I have shown only a preferred embodiment of my invention by way of illustration, many modiffications will occur to those skilled in the art, and I therefore wish to have it understood that I intend in the appended claims to cover all such modifications as fall within the true spirit and scope of my invention.

What I claim as new and desire to secure by Letters Patent of the United States is:

1. In combination, a pair of supply terminals for connection to a substantially constant voltage source of alternating electric current supply, a self-saturating magnetic amplifier having reactor windings connected to said terminals and having a direct current output circuit, and a saturable reactor comprising an alternating current winding connected in series circuit relation between said reactor windings and said terminals and a saturating winding connected in said output circuit in series circuit relation thereby to reduce the voltages applied to said reactor windings as the amplifier output current decreases.

2. In combination, a pair of supply terminals for connection to a substantially constant voltage source of alternating electric current supply, a self-saturating magnetic amplifier having reactor windings connected to said terminals and having an output circuit, and a saturable reactor comprising an alternating current winding connected in series circuit relation between said reactor windings and said terminals, and a saturating winding coupled to said output circuit in series circuit relation thereby to reduce the voltage applied to said reactor windings as the output circuit current decreases.

3. In combination, a pair of supply terminals for connection to a substantially constant voltage source of alternating electric current supply, a self-saturating magnetic amplifier having reactor windings connected to said terminals and having an output circuit, a saturable reactor comprising an alternating current winding connected in series circuit relation between said reactor windings and said terminals and a direct current saturating winding coupled to said output circuit in series circuit relation, and an electric impedance element connected across said terminals in series circuit relation with said alternating current reactor winding.

4. In combination, a pair of supply terminals for connection to a substantially constant voltage source of alternating electric current supply, a self-saturating magnetic amplifier having reactor windings connected to said terminals and including a direct current output circuit, a saturable reactor comprising an alternating current winding connected in series circuit relation between said reactor windings and said terminals and a direct current saturating winding connected in series circuit relation in said output circuit, and an electric impedance element connected across said terminals in series circuit relation with said alternating current reactor winding.

5. In combination, a pair of supply terminals for connection to a substantially constant voltage source of alternating electric current supply, a self-saturating magnetic amplifier having reactor windings connected to said terminals and having an output circuit, a saturable reactor comprising an alternating current winding connected in series circuit relation between said reactor windings and said terminals, means responsive to current in said output circuit for controlling the saturation of said reactor, and an electric impedance element connected across said terminals in series circuit relation with said alternating current reactor winding.

6. In combination, a pair of supply terminals for connection to a substantially constant voltage source of alternating electric current supply, a self-saturating magnetic amplifier having reactor windings connected to said terminals and having an output circuit, a saturable reactor comprising an alternating current winding connected in series circuit relation between said reactor windings and said terminals and a direct current saturating winding, means responsive to the current in said output circuit for controlling the saturation of said reactor, an electric impedance element connected across said terminals in series circuit relation with said reactor windings, and means responsive to the voltage across said impedance element for variably magnetically biasing said amplifier.

7. In combination, a pair of supply terminals for connection to a substantially constant voltage source of alternating electric current supply, a self-saturating magnetic amplifier having reactor windings connected to said terminals and including an output circuit, a saturable reactor comprising an alternating current winding connected in series circuit relation between said reactor windings and said terminals and a direct current saturating winding coupled to said output circuit in series circuit relation, an electric impedance element connected across said terminals in series circuit relation with said alternating current reactor winding, and means responsive to the voltage across said impedance element for variably magnetically biasing said amplifier.

8. In combination, a pair of supply terminals for connection to a substantially constant voltage source of alternating electric current supply, a self-saturating magnetic amplifier having reactor windings connected to said terminals and a direct current bias winding, said reactor including an output circuit, a saturable reactor comprising an alternating current winding connected in series circuit relation between said reactor windings and said terminals and a direct current saturating winding, means for energizing said saturating winding in response to the current in said output circuit, an electric impedance element connected across said terminals in series circuit relation with said alternating current reactor winding, and rectifying means coupling said bias winding across at least a portion of said impedance element.

9. In combination, a pair of supply terminals for connection to a substantially constant voltage source of alternating electric current supply, a self-saturating magnetic amplifier having reactor windings connected to said terminals and including a direct current bias winding and a direct current signal winding, said amplifier having an output circuit, a saturable reactor comprising an alternating current winding connected in series circuit relation between said reactor windings and said terminals and a direct current saturating winding, means coupling said saturating winding for energization in response to the current of said output circuit, an electric impedance element connected across said terminals in series circuit relation with said alternating current reactor winding, and rectifier means coupling said bias winding across at least a portion of said impedance element for energization in differential relation with the normal direction of energization of said signal winding.

10. In combination, a pair of supply terminals for connection to a substantially constant voltage source of alternating electric current supply, a single-ended bridge type self-saturating magnetic amplifier having reactor windings connected to said terminals and having a direct current output circuit, a saturable reactor including an alternating current winding connected in series circuit relation between said reactor windings and said terminals, and means responsive to the current in said output circuit for controlling the saturation of said reactor thereby to reduce the voltage applied to said reactor windings as the current in said output circuit decreases.

11. In combination, a pair of supply terminals for connection to a substantially constant voltage source of alternating electric current supply, a single-ended, self-saturating magnetic amplifier having alternating current input terminals connected to said supply terminals and including a direct current bias winding and a direct current signal winding, said amplifier having a direct current output circuit, a saturable reactor including an alternating current winding connected in series circuit relation between said supply and input terminals and a saturating winding connected in series circuit relation in said output circuit, a bleeder resistor connected across said input terminals, and a rectifier connected to energize said bias winding in response to the voltage across said resistor and in differential relation with the normal direction of energization of said signal winding.

References Cited in the file of this patent

UNITED STATES PATENTS

| | | |
|---|---|---|
| 2,027,311 | FitzGerald | Jan. 7, 1936 |
| 2,246,302 | Hauffe et al. | June 17, 1941 |
| 2,388,070 | Middel | Oct. 30, 1945 |
| 2,509,864 | Hedstrom | May 30, 1950 |
| 2,683,853 | Logan | July 13, 1954 |

OTHER REFERENCES

"Feedback in Magnetic Amplifiers," by Fitzgerald, Electrical Communication, vol. 27, issue 4, pp. 298–319, December 1950, page 302 pertinent.